United States Patent [19]

Lam

[11] Patent Number: 4,695,749

[45] Date of Patent: Sep. 22, 1987

[54] EMITTER-COUPLED LOGIC MULTIPLEXER

[75] Inventor: Nim C. Lam, Sunnyvale, Calif.

[73] Assignee: Fairchild Semiconductor Corporation, Cupertine, Calif.

[21] Appl. No.: 832,797

[22] Filed: Feb. 25, 1986

[51] Int. Cl.$^4$ .................... H03K 19/086; H03K 17/62
[52] U.S. Cl. .................................... 307/455; 307/243; 307/454; 307/467
[58] Field of Search ............... 307/454, 455, 467, 445, 307/254, 243; 364/716

[56] References Cited

U.S. PATENT DOCUMENTS

| | | | |
|---|---|---|---|
| 3,519,810 | 7/1970 | Priel et al. | 307/455 X |
| 3,639,781 | 2/1972 | Marley | 307/467 |
| 3,906,212 | 9/1975 | Poguntke | 307/455 X |
| 4,167,727 | 9/1979 | Anderson et al. | 307/467 |
| 4,215,418 | 7/1980 | Muramatsu | 307/455 X |
| 4,276,488 | 6/1981 | Benedict et al. | 307/455 X |
| 4,408,134 | 10/1983 | Allen | 307/455 X |
| 4,560,888 | 12/1985 | Oida | 307/455 X |
| 4,580,066 | 4/1986 | Berndt | 307/467 |
| 4,613,774 | 9/1986 | Mazumder | 307/455 X |
| 4,617,475 | 10/1986 | Reinschmidt | 307/455 X |
| 4,628,216 | 12/1986 | Mazumder | 307/455 |

FOREIGN PATENT DOCUMENTS 2146863  4/1985 United Kingdom ............... 307/455

OTHER PUBLICATIONS

Gosch, "Bipolar Multiplexer can Reach 2 Gb/s"; *Electronics;* p. 96; 10/06/1983.
Cooperman, "High Speed Current Mode Logic for LSI", *IEEE Trans. on Circuits and Systems;* vol. CAS-27, No. 7, pp. 626-635; 7/1980.
Underwood, "Cascode Current Switch ALU"; *IBM TDB;* vol. 21, No. 12, pp. 4808-4810; 5/1979.

*Primary Examiner*—Stanley D. Miller
*Assistant Examiner*—D. R. Hudspeth
*Attorney, Agent, or Firm*—Clifton L. Anderson

[57] ABSTRACT

An emitter-coupled multiplexer has all transistors directly controlled by one select signal in parallel with transistors directly controlled by other select signals. Thus, in a 3:1 multiplexer (100), a first select signal (S0) directly controls one transistor (Q13); this transistor is in parallel with another transistor (Q14) which is directly controlled by a second select signal (S1). The second select signal also directly controls another transistor (Q15) in the same network (102). This transistor is in parallel with a transistor directly controlled by an input signal (I1) which is thus masked when the second select signal is activated. The second select signal also controls (at Q16 and Q18) subnetwork selection in another current network (104) of the multiplexer. The disclosed arrangement permits the multiplexer function to be implemented with a reduced transistor count and only two current sources in two-level series gating.

5 Claims, 1 Drawing Figure

EMITTER-COUPLED LOGIC MULTIPLEXER

BACKGROUND OF THE INVENTION

The present invention relates to integrated circuits, and, more particularly, to an emitter-coupled logic multiplexer.

Gate arrays are semiconductor devices with standard doping layers and customizable mtealization layers. Gate arrays allow a design effort to obtain application specific integrated circuits while avoiding the long lead times involved in designing a circuit from scratch. Since they are neither off-the-shelf items, nor entirely customized, gate arrays are considered semi-custom devices. Gate arrays can be fabricated according to a variety of process technologies, for example, complementary metal-on-oxide (CMOS) and bipolar emitter-coupled logic (ECL).

To facilitate the customizing of a gate array, the gate array is divided into a number to transistor groupings or "cells". A cell library is often made available which defines macros, each of which corresponds to a logic function or combination of functions which can be implemented in a predetermined number of cells or fractions thereof. In some gate array designs, a given function may be implemented many times. Thus, given the competitive condition of the gate array industry, it is a commercial necessity to implement each logic function as efficiently as possible to maximize the functionality of the completed gate array design. To a first approximation, efficient implementation means minimizing transistor count and the number of current sources for a given number of gating levels.

When high switching speeds are required, ECL is often the process of choice. Rather than switching current on and off, ECL circuits redirect a constant magnitude network current through alternate paths. Transistors in an ECL circuit remain in their linear operating regions and, accordingly, are not subject to the delays involved in switching in and out of saturation.

A typical ECL circuit includes a voltage source, a current network and a gating system. The voltage source is generally considered as separate high (VCC) and low (VEE) sources. The voltage source applies a potential difference across the network so as to generate a current through one, or sometimes more, of the paths that constitute the network. The gating system determines the path or paths through which the network current flows at any given time.

An elementary gate includes a "switching" transistor and a "reference" transistor, which are characterized by the voltages applied to their bases. The voltage applied to the base of a "reference" transistor is a constant reference voltage (VBB), usually between VCC and VEE. The voltage applied to the base of a "switching" transistor is usually discretely variable between a voltage above VBB and a voltage below VBB.

The elementary gate's switching and reference transistors have their emitters coupled) hence the designation "emitter-coupled logic", and their collectors uncoupled. "Coupled" implies the existence of a conductive path between coupled elements. Whether a conductive path is coupling depends on the operational significance of any voltage drops along the path. If current through the path undergoes a voltage drop comparable to, e.g., is one third or more of, that which the same current would undergo through a transistor, there is no coupling, and the elements electrically connected by the path are "uncoupled", as the term is used herein. If the resistance is such that the voltage drop caused by an operational current is substantially less than e.g., less than one tenth, that the same current would undergo through a transistor, then elements connected by the path are considered "coupled".

The operation of this elementary gate in the context of a circuit with a voltage applied across the gate is straightforward. When the voltage at the base of the switching transistor is below the reference voltage VBB, current flows from the high voltage source, through the reference transistor via its respective load resistor and eventually to the low voltage source. Alternatively, when the voltage applied to the base of the switching transistor is higher than the reference voltage VBB, current flows through the switching transistor. Thus, the gating system, by controlling the voltage at the base of the switching transistor determines the path of the current through the gate.

Where a load resistance is placed in series between the high voltage source and the collector of the reference transistior, a low voltage at the base of the switching transistor causes a voltage drop across the load resistor; no such drop occurs when the voltage at the base of the switching transistor is high. Accordingly, the voltage at the base of the switching transistor can control an output determined by the voltage between the load resistor and the collector of the reference transistor. Analogous effects can be achieved by incorporating a load resistor between the high voltage source and the collector of the switching transistor.

A common approach to elaborating upon the elementary gate is to place a second switching transistor in parallel with the first to produce an OR gate. In such an OR gate, the voltages at the bases of the switching transistors are the inputs, while the output is provided by a voltage between a load resistor and the collector of the reference transistor, or the coupled collectors of the parallel switching transistors.

Such gates are incorporated into current networks. Each current network is defined by a current source transistor through which substantially all of the network current flows. Networks can be categorized according to the number of gating levels involved. A one-level series gating network might include the OR gate described above with the gate emitter coupled to the collector of the source transistor. In a two-level series gating network, the sources of current at the collectors of the reference transistor and the switching transistors would be determined by another set of gates electrically between the OR gate and the high-voltage source. Higher level series gating structures can be generated by extension.

Multi-level series gating networks include current subnetworks as well as current paths. A subnetwork is constituted by a set of one or more network current paths which share a transistor which defines the subnetwork. The "subnetwork" transistor of a given network is defined to be the common transistor at the lowest voltage level in the constituting paths other than the network current source transistor and the defining transistors of any subnetworks which include the given network. Subnetworks on the same level are mutually exclusive in the sense that a given network current path must belong to one and only one subnetwork on a given level.

3

As indicated above, competition in the gate array industry renders it imperative to maximize the functionality of gate array cells. Maximizing functionality is especially important for cells which are likely to be repeated many times within a given gate array design. A multiplexer (MUX) cell, for example, may be implemented hundreds of times within a design intended for complex information routing. A multiplexer is basically a switch the output of which is, or is the inverse of, a selected one of several inputs. The MUX is characterizable by the number of inputs, e.g. there are 2:1 MUXs, 3:1 MUXs, 4:1 MUXs, etc. Typically, a MUX includes an output, the several inputs, and select lines.

When dealing with standard binary logic, multiplexers with inputs equaling a power of two are the most efficiently implemented. This is due to the fact that there are $2^n$ combinations of off/on selections for n select lines. When the number of the input lines is between $2^{n-}$ and $2^n$, n select lines are still needed, but some of the possible combinations are not used. ECL logic designers have surrendered to this binary logic by degenerating from a $2^n$ design when the number of inputs required is not a power of 2. The most prominent victim of this approach is the 3:1 MUX, which is generally implemented as a 4:1 MUX with one imput amputated. However, the competitive pressures of the gate array industry demand more optimal configurations, such as the one disclosed and claimed hereinbelow.

SUMMARY OF THE INVENTION

The present invention provides an emitter-coupled logic multiplexer in which one select signal, in every instance, is logically ORed with at least one other select signal. One way to implement this is to parallel each transistor directly controlled by this select signal with a transistor controlled by another select signal. Herein, a transistor is "directly controlled" by a signal if that signal or its complement is applied to the base of the transistor.

Stated more formally, a multiplexer in accordance with the present invention includes a set A of transistors. A subset B comprises those transistors of set A directly controlled by select signals. Subset B includes two exhaustive and mutually exclusive subsets: subset C comprises those transistors directly controlled by a select signal SO, and subset D comprises those transistors directly controlled by other select signals. In the present invention, every transistor in subset C is in parallel with a transistor in subset D. Preferably, given that the set C of select signals has n elements, the number d of data input lines to be selected is $2^{n-} < d < 2^n$.

One realization of this invention is an emitter-coupled logic 3:1 MUX having three data inputs, two select inputs, an output and two current networks. The first and second inputs directly control transistors in the first current network. The third input directly controls a transistor in the second current network.

The higher order select line directly controls three transistors. The first of these transistors enables or masks the action of the third input. The second of the transistors is in parallel with the transistor directly controlled by the lower order select line. The third of these transistors is in parallel with the transistor directly controlled by the second input line.

When the higher order select line is off, current in the second network bypasses the transistor directly controlled by the third input line and the reference transistor coupled to it so that the third input does not affect

4 the output. The first current network includes the gate directly controlled by the first input signal and the gate directly controlled by the second input signal. The lower order select signal determines which of these gates is active. Thus, when the higher order select line is low, the output reflects the first input signal when the lower order select signal is low, and the output reflects the second input signal when the lower order select signal is high.

When the higher order select line is held high, one transistor directly controlled by it enables the third data input so that it is reflected in the multiplexer output. The second transistor directly controlled by the higher order select line has the same effect as the transistor directly controlled by the lower order select line and forces the current in the first network to arrive through the gate controlled by the second input line. Thus, the first input is masked. The third transistor directly controlled by the higher order select line has the same effect as the second input line. Since the higher order select is held high, it masks this second input from the ouput. Thus, only the third input signal is reflected at the output, completing the 3:1 MUX.

In terms of the formalism set forth earlier, set A includes all the transistors in the 3:1 MUX. Set B={QX1, QY1, QY2, QY3} where QX1 is the sole transistor directly controlled by the lower order select line X, and QY1, QY2 and QY3 are directly controlled by the higher order select line Y, and QY1 is in parallel with QX1. Subset C={QX1} and Subset D={QY1, QY2, QY3}. Every element of Subset C (there is only one) is in parallel with at least one element of set D. A semantic note: {every} is used in its logic sense to denote inclusion. Thus, an expression of the form {every A is B} is equivalent to the expression "there does not exist an A which is not B." Herein, the work "every"does not connote plurality, as it does somtimes when used colloquially.

Thus, a novel ECL MUX is presented. The invention provides for a 3:1 MUX inmplemented with two gating levels, two current sources and only seventeen transistors. This advantageous embodiment is presented in greater detail below in connection with the drawing.

DETAILED DESCRIPTION OF THE PREFERRED EMBODIMENT

Figure 1:
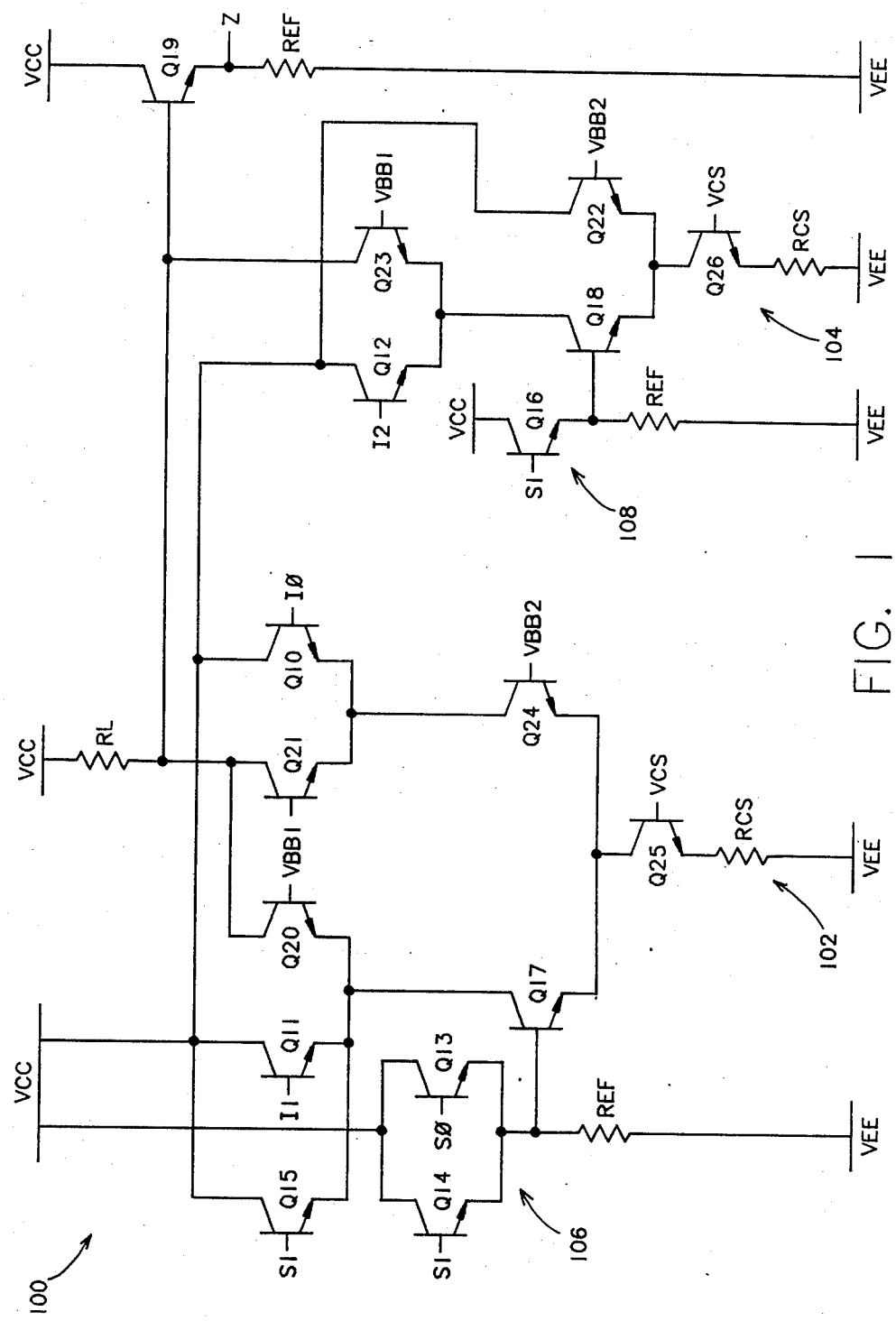
FIG. 1 is a schematic of an ECL 3:1 multiplexer in accordance with the present invention.

The present invention provides for an ECL multiplexer 100 having three data input lines I0, I1 and I2, provisions for higher and lower order select signals S1 and S0, and an output Z. The value at the output Z is determined by the voltage drop across a load transistor RL. When current flows through RL, the voltage is added to that of output transistor Q19 so that Z goes low. When negligible current flows through the load resistor RL, the output transistor Q19 is the only voltage drop from VCC to Z, so output Z is high.

This 3:1 multiplexer includes two unit current source networks 102 and 104 identified by their respective current source transistors Q25 and Q26. A "network" is defined herein as a collection of paths through which an ECL operating current can flow. Network 102 includes two subnetwork respectively defined by switching transistor Q17 and reference transistor Q24. Network 104 includes two subnetworks, respectively defined by reference transistor Q22 and switching transistor Q18.

In network 102, subnetwork selection is performed by switching section 106 which determines the voltage at the base of switching transistor Q17. When the base of either transistor Q13 or Q14 is at a "high" level, switching transistor Q17 is on, and the current through electron current source transistor Q25 passes through switching transistor Q17. When both Q13 and Q14 are low, the current through electron source transistor Q25 passes through reference transistor Q24.

Likewise, in network 104, subnetwork selection is performed by switching section 108, which controls the voltage at switching transistor Q18. When the base of transistor Q16 is at a high level, the current through electron current source transistor Q26 flows through switching transistor Q18. When transistor Q16 is off, the corresponding network current flows through reference transistor Q22.

Each network 102, 104 includes multiple paths. In network 102, the subnetwork defined by switching transistor Q17 includes three paths respectively defined by switching transistors Q15 and Q11 and referece transistor Q20. The subnetwork defined by reference transistor Q24 includes two paths, respectively defined by switching transistor Q10 and reference transistor Q21.

In network 104, the subnetwork defined by switching transistor Q18 includes two paths, respectively defined by switching transistor Q12 and reference transistor Q23. The remaining subnetwork, defined by reference transistor Q22, is unitary.

The paths can be divided into two groups, those including the load resistor RL and those not including it. The paths including the load resistor RL are defined by reference transistors, namely, Q20, Q21 and Q23. If current flows through one of these paths, the output Z is low; otherwise the output Z is high. From an operational standpoint, the main variable of interset is which input, if any, is affecting the output. This depends on the status of the select lines.

When both S1 and S0 are low, input I0 directly controls the output Z in that Z=I0, as explained below. Note that the select signal S1 directly controls three switching transistor Q14, Q15 and Q16, while select signal S0 directly controls one transistor Q13. When S1 is low, Q16, and, henece, Q18 are low, so I2 has no effect on the output. The path through reference transistor Q22 does not include RL, so network 104 is effectively masked from the output Z.

Still considering the case where both select signal S0 and S1 are low, in network 102, transistors Q13 and Q14 are off so that transistor Q17 is off and transistor Q24 is on. Since transistor Q17 is off, there is no current through I1 switched transistor Q11, so that I1 is not reflected in the output Z. In this case, when I0 is high, the load resistor RL is bypassed and the output Z is high. When I0 is low, reference transistor Q21 is on and current flows through RL, Q21, Q24 and Q25. The resulting current drop across RL renders a low output Z. Thus, when S1 = S0 = (logic) 0, the output Z reflects I0.

When S1 is low and S0 is high, switching transistor Q13 and, hence, switching transistor Q17 are on. Reference transistor Q24 is off, so I0 is now blocked. I2 is blocked as described above since S1 is the same in both cases. If I1 is high, the current through electron current source transistor 25 flows through switching transistor Q17 and switching transistor Q11, bypassing resistor RL, so the output Z is high. If I1 is low, the current flows through reference transistor Q20 and hence load resistor RL, so that the output Z is low. Accordingly, when S1 is low and S0 is high, input I1 directly controls the output Z.

When S1 is high, switching transistor Q16 and hence switching transistor Q18 are on. When I2 is high, the current through switching resistor Q12 bypasses the load resistor RL, and when I2 is low, the current through reference transistor Q23 is drawn through the load resistor RL so the output Z goes low. Thus, I2 can directly control the output Z, provided that when I2 is high, no path through network 102 can draw current through the load resistor RL. Current through the load resistor RL cannot pass through reference transistor Q21 since reference transistor Q24 is off. Current cannot pass through reference transistor Q20 since that resistor is off due to the action of the high S1 signal at switching transistor Q15. Note that when S1 is high, Q14 is on so as to mask the status of Q13 so that S0 has no effect on the output.

In summary, when both select signals S0 and S2 are low, the output reflects I0. When S1 is low and S0 is high, input I1 is selected, and when S1 is high, I2 directly controls the output. Thus a 3:1 MUX is implemented. Note that only 17 transistors and two current sources are used. It is noted that current source resistors RCS and emitter-follower resistors REF assume their conventional roles.

The present invention provides for many variations and modifications of the described embodiment. Inverted outputs may be provided for by including resistors in series with the collectors of switching transistors. Multiplexers with ratios other than 3:1 are provided for. For example, a 6:1 multiplexer can include two 3:1 multiplexers similar to the one detailed above and an additional select line can be paralleled to other select lines as necessary to select between the 3:1 multiplexers. A great many other implementations are provided for. Therefore, the present invention is limited only by the scope of the following claims.

What is claimed is:

1. An ECL multiplexer comprising:
voltage means, including a high voltage source and a low voltage source, for supplying a potential differential between said high voltage source and said low voltage source, said voltage means further including reference voltage means for supplying constant voltage inputs:
current network means, including multiple paths, for providing multiple paths through which current can flow between said high voltage source and said low voltage source, said current network means being coupled to said voltage means output means, coupled to said current network means, for outputting a voltage as a function of which of said paths is carrying current;
said current network means including reference transistors, each reference transistor including an emitter, a collector and a base, the base of each said reference transistor being coupled to receive a constant voltage supplied by said reference voltage means, the collector and emitter of each reference transistor defining a reference electrical segment;
said current network means including data transistors for receiving plural data input signals, each data transistor including an emitter, a collector and a base, the base of each said data transistor being coupled to receive one of said data input signals, the collector and emitter of each reference transistor defining a data electrical segment, each said reference electrical segment and each data electrical segment constituting a segment of at least one of said paths so that current flows through such at least one path when and only when current flows through said segment, each said data transistor being in emitter-coupled relation with a respective one of said reference transistors so that, when the voltage at the base of a given data transistor is greater than the constant voltage supplied to the base of the reference transistor emitter-coupled thereto, current is prohibited through said associated emitter-coupled reference transistor, and so that, when the voltage at the base of that data transistor is less than the constant voltage supplied to the base of the reference transistor emitter-coupled thereto, current is prohibited through said given data transistor; and first and second non-empty sets of select transistors for receiving plural select signals, each select transistor including an emitter, a collector and a base, the base of each select transistor being coupled to receive one of said select signals, each select transistor of said first set being coupled to receive a first of said plural select signals at its base, each transistor coupled so that its base can receive said first select signal being included in said first set, each transistor of said second set being coupled to receive another of said select signals at its base, said select transistors being operatively connected to said current network means so as to collectively prohibit current flow through all but at most one of said reference transistors having a data transistor emitter-coupled thereto, the set of reference transistors through which current is prohibited being a well-defined multi-variate function of the values of said select input signals whereby the multiplexer function is realized, each transistor of said first set being in parallel with a transistor of said second set.

2. The multiplexer of claim 1 further characterized in that the relation $2^{n-1} < d < 2^n$ is satisfied, where n is the total number of select transistors in said first and second non-empty sets and d is the number of data transistors.

3. A 3:1 multiplexer vomprising:
voltage means, including a high voltage source and a low voltage source, for supplying a potential differential between said voltage sources, said voltage means further comprising reference voltage means for supplying constant voltage inputs;

current network means including multiple paths for providing paths through which current can flow between said voltage sources, said current network means being coupled to said voltage means output means, coupled to said current network means) for outputting a voltage as a function of which of said paths is carrying current;

said current network means including reference transistors, each reference transistor including an emitter, a collector and a base, the base of each said reference transistor being coupled to receive a constant voltage supplied by said reference voltage means, the collector and emitter of each reference transistor defining a reference electrical segment;

said current network means including first, second and third data transistors, each data transistor including an emitter, a collector and a base, the base of each said data transistor being coupled to receive the respective one of first, second, and third data input signals, the collector and emitter of each reference transistor defining a data electrical segment, each said reference electrical segment and each said data electrical segment constituting a segment of at least one of said paths so that current flows through such at least one path when and only when current flows through said segment, each said data transistor being in emitter-coupled relation with a respective one of said reference transistors so that, when the voltage at the base of a given data transistor is greater than the constant voltage supplied to the base of the reference transistor emitter-coupled thereto, current is prohibited through said associated emitter-coupled reference transistor, and so that, when the voltage at the base of that data transistor is less than the constant voltage supplied to the base of the reference transistor emitter-coupled thereto, current is prohibited through said given data transistor; and first and second non-empty sets of select transistors for receiving first and second select signals, each select transistor including an emitter, a collector and a base, the base of each select transistor of said first set being coupled to receive said first select signal, the base of each transistor of said second set being coupled to receive a second select signal, said select transistors being operatively connected to said current network means so as to collectively prohibit current flow through at least two of said reference transistors having a data transistor emitter-coupled thereto, the reference transistors through which current is prohibited being a function of the collective values of said select input signals, each select transistor of said first set being coupled in parallel with a select transistor of said second set.

4. The multiplexer of claim 3 further characterized in that said first set contains exactly one transistor and said second set contains exactly three transistors.

5. An ECL 3:1 multiplexer comprising:
a high voltage node;
a resistive load;
an output line connected to said high voltage node through said resistive load so that when no current flows through said resistive load said output line assumes a first logic level, and so when substantial current flows through said resistive load said output assumes a second logic level;
a first current path network including a first low voltage node, said first network including first and second subnetworks, said first subnetwork including a current path between said high voltage node and said first low voltage node, said second subnetwork including second and third current paths between said high voltage node and said first low voltage node, exactly one of said second and third current paths including said resistive load;
gating means responsive to a first data input and coupled to said second and third current paths for selecting between said second and third current paths as the active current paths;

gating means responsive to a first select signal and coupled to said first and second subnetworks for selecting between said first subnetwork and said second subnetwork as the active current subnetwork of said first network;

a second network including a second low voltage node, said second network including third and fourth subnetworks, and third subnetwork including fourth and fifth current paths extending between said high voltage node and said second low voltage node, one of said fourth and fifth current paths including said resistive load, said fourth subnetwork including sixth and seventh and eighth current paths, one of said sixth and seventh current paths including said resistive load, one of said eighth and sixth paths including said resistive load;

gating means responsive to a second data input signal and coupled to said fourth and fifth paths for selecting between said fourth and fifth paths for activation;

gating means responsive to a third data input signal and coupled to said sixth and seventh paths for selecting between said sixth and seventh paths for activation;

gating means responsive to said first select signal and coupled to said eighth and sixth paths for selecting between said eighth and sixth paths for activation; and gating means responsive to a logical combination of said first select signal and a second select signal and coupled to said third and fourth networks for selecting between said third and fourth subnetworks for activation.

* * * * *